United States Patent

Wood

[15] 3,680,198

[45] Aug. 1, 1972

[54] ASSEMBLY METHOD FOR ATTACHING SEMICONDUCTOR DEVICES

[72] Inventor: John R. Wood, Sunnyvale, Calif.

[73] Assignee: Fairchild Camera and Instrument Corporation, Mountain View, Calif.

[22] Filed: Oct. 7, 1970

[21] Appl. No.: 78,897

[52] U.S. Cl. ..........................29/498, 29/502, 29/589

[51] Int. Cl. ..........................B23k 31/02, B23k 35/24

[58] Field of Search......29/472.1, 498, 502, 589, 590

[56] References Cited

UNITED STATES PATENTS

| | | | |
|---|---|---|---|
| 2,736,847 | 2/1956 | Barnes | 29/498 UX |
| 3,209,450 | 10/1965 | Klein et al. | 29/498 X |
| 3,292,240 | 12/1966 | McNutt et al. | 29/498 X |
| 3,392,442 | 7/1968 | Napier et al. | 29/498 X |
| 3,486,223 | 12/1964 | Butera | 29/502 X |
| 3,585,711 | 6/1971 | Hicks | 29/590 X |
| 3,589,000 | 6/1971 | Golli | 29/590 X |
| 3,593,412 | 7/1971 | Foote | 28/589 |

*Primary Examiner*—John F. Campbell
*Assistant Examiner*—Ronald J. Shore
*Attorney*—Roger S. Borovoy and Alan H. MacPherson

[57] ABSTRACT

A method of attaching a semiconductor die having an interconnecting pattern on one side of it, and having a given liquidus temperature, to a substrate which also has a metal pattern upon it corresponding with the metal pattern on the die, the substrate metal pattern having a melting point at least 10° C. less than the liquidus temperature of the die metal pattern, including the steps of: (1) picking up the die from its backside with a heated pickup tool: (2) transferring the heat from the tool to the die pattern through the backside, the amount of heat being insufficient to totally melt the die metal pattern; (3) placing the die adjacent the substrate so the heated die metal pattern is in registration with the substrate metal pattern, causing the substrate metal pattern to melt: (4) cooling the substrate and the die with their registered metal patterns in contact, thereby resolidifying the metal and forming a rigid mechanical and metallurgical joint between the two metal patterns.

2 Claims, 2 Drawing Figures

INVENTOR.
JOHN R. WOOD
BY [signature]
ATTORNEY

ASSEMBLY METHOD FOR ATTACHING SEMICONDUCTOR DEVICES

BACKGROUND OF THE INVENTION

It has long been desirable in semiconductor manufacture to eliminate wire bonds between semiconductor dice and their packages. Wire bonding is time consuming, must be done individually, is sometimes unreliable, and increases the labor cost of the semiconductor device. Commonly, wire bonding has been eliminated by using bumps on one surface of the semiconductor die which are then registered with and bonded to a metallized substrate. These bumps are made of a solder (lead-tin) material. The bumps are placed in registration with the substrate, and the entire assembly heated in a furnace to a temperature in excess of the melting point of the solder so that the solder is melted, reflowed, and solidified in contact with the substrate. Examples of these techniques are found in U.S. Pat. Nos. 3,292,240; 3,456,159; 3,303,393; 3,392,442; and 3,429,040.

The above prior art techniques have certain disadvantages. In order to assure uniform stand-off distance between the chip and the substrate, it is important that the bumps not be melted. Therefore the furnace temperature is chosen so that the bumps are not raised above their solidus temperature. Only the solder on the substrate is heated to a liquidus state. To achieve this result, accurate furnace temperature control and timing are required.

Moreover when many closely adjacent die are joined to the same substrate, heat is transferred to surrounding dice which have already been joined, melting contacts of adjacent die. Finally, location of the chip on the substrate and the electrical joining have been done in separate states (the latter step in a furnace). This increased capital equipment requirements, reduced the speed of manufacture, and necessitated extra handling.

BRIEF DESCRIPTION OF THE INVENTION

The subject invention provides a technique of joining a die having a metal pattern upon one side, such as a bump or a beam, which avoids the disadvantages of the prior art. Briefly, the invention employs two laterally corresponding metal patterns, one on the die and one on the substrate. The substrate metal pattern has a liquidus temperature at least 10°C below the liquidus temperature of the die metal pattern. The die is picked up by its backside (the side opposite from the metal pattern) with a heated pickup tool. Heat is transferred from the tool to the die metal pattern, that is from the backside to the frontside of the die. The amount of such transferred heat is sufficient to bring the die metal pattern to a temperature above its solidus temperature but insufficient to bring the die metal pattern to its liquidus temperature. Contrary to the prior art furnace-joining techniques, time is not critical. The die may be maintained at this intermediate temperature as long as necessary prior to joining. The heated die is then placed with the metal pattern side down adjacent to, in mechanical contact with and in registration with the corresponding substrate metal pattern. The heat of the heated die metal pattern is transferred to the substrate metal pattern, causing the lower-melting substrate metal pattern to melt. When the substrate and die are together cooled with their registered metal patterns in contact, the metal is resolidified and a rigid mechanical and metallurgical joint is formed between the two metal patterns.

Because the metal pattern on the die is only partially melted prior to final joinder, the amount of bump height (and therefore the stand-off height) are still readily controlled. It is easy to control the deposition of a metal on the semiconductor die to achieve a very uniform height. This height is uniformly changed during joinder. The die is joined absolutely parallel to the substrate and the stand-off height of all fourteen or more bumps is absolutely uniform. The metallurgical bond, however, between the partially molten bump and the lower-melting molten substrate metal forms a much better metallurgical bond than in the prior art techniques where only the substrate metal and not the bumps is appreciably molten. Finally, pickup, alignment, and joinder of the die and the substrate can be accomplished in a single operation.

The details of the invention will be better understood from the specific description below, making reference to the drawings, in which.

Figure 1:
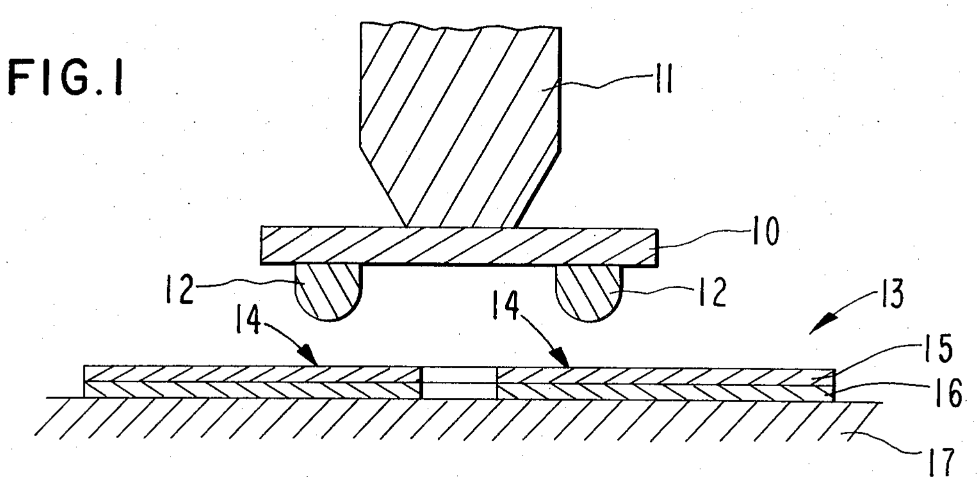
FIG. 1 shows the die held by the tool just before joinder to the substrate.

Referring now to FIG. 1, a die 10 is shown, held, for example by the pull of a vacuum, tightly adjacent to tool 11. Die 10 has an interconnecting metal pattern, or "bumps" 12 on its lowermost side. Although the type of metal used in the pattern is not critical, most commonly employed is an alloy of lead and tin, e.g., 90% lead and 10% tin, but may also contain traces of other metals such as antimony and bismuth. The metal pattern or bumps 12 are geographically oriented on the lowermost surface of die 10 to correspond with the desired attachment positions on substrate 13. Die 10 and substrate 13 will be aligned and die 10 will be lowered directly onto the position on substrate 13 indicated by arrows 14.

Substrate 13 also has a metal pattern, which, in the example shown, has two layers 15 and 16. For example, the lower layer 16 can be an inert metal such as nickel, which makes good physical contact with the material of substrate 17. The substrate material is normally nonconducting, and may for example be ceramic. The lower layer 16 takes no part in the joining operation, so that its choice is noncritical. Layer 15, on the other hand, which may for example be tin, will be physically joined to and make good electrical contact with bumps 12. Layer 15 must therefore have a liquidus temperature at least 10° C less than the liquidus temperature of bumps 12. The liquidus temperature of bumps 12, particularly for lead/tin bumps, is well defined in the literature (*Constitution of Binary Alloys*, Hanson, McGraw-Hill Metallurgy and Metallurgical Engineering Series, Second Edition, 1958, page 1107). The liquidus temperature is defined as the temperature above which the alloy, having a given mixture of the two metals, becomes liquid. It is analogous to the melting point of a single metal. The liquidus temperature is normally a temperature between the eutectic temperature of the two metals and the melting point of the higher-melting metal of the two.

The method of the subject invention begins by picking up die 10 by its backside with pickup tool 11, as shown in FIG. 1. Tool 11 is heated by means of an electrical coil (not shown) or other suitable method to heat the tip of the tool which comes in contact with die 10. Heat is transferred by direct conduction from tool 11 through the back-side of die 10 to the frontside and to bumps 12. The amount of such transferred heat is sufficient to bring the die metal pattern, or bumps 12 above their solidus temperature, but not sufficient to bring them to their liquidus temperature. In a preferred embodiment of the invention, where bumps 12 are made of an alloy of about 88% lead, about 10% tin, and about 2.0% bismuth, the bumps are heated to a temperature between about 225° C and 305° C prior to joinder, preferably between about 250° C and 290° C. Excellent results have been obtained using a heating temperature of 270° C. When other metals are added to lead and tin, such as bismuth, antimony, or indium, the lower temperature of the range (the solidus) is lowered, allowing a wider temperature range to be used. Other alloys will require other temperature ranges.

Tool 11 is then lowered towards substrate 13 in order to bring bumps 12 in mechanical contact with substrate 13 at the predetermined points 14 shown in FIG. 1. Optical techniques for achieving proper registration of the substrate and the die are well known in the semiconductor art. The heat contained in bumps 12 is then transferred at points 14 to the upper metal layer 15 on substrate 13, causing that layer to melt. Lower layer 16 is substantially unaffected.

Figure 2:
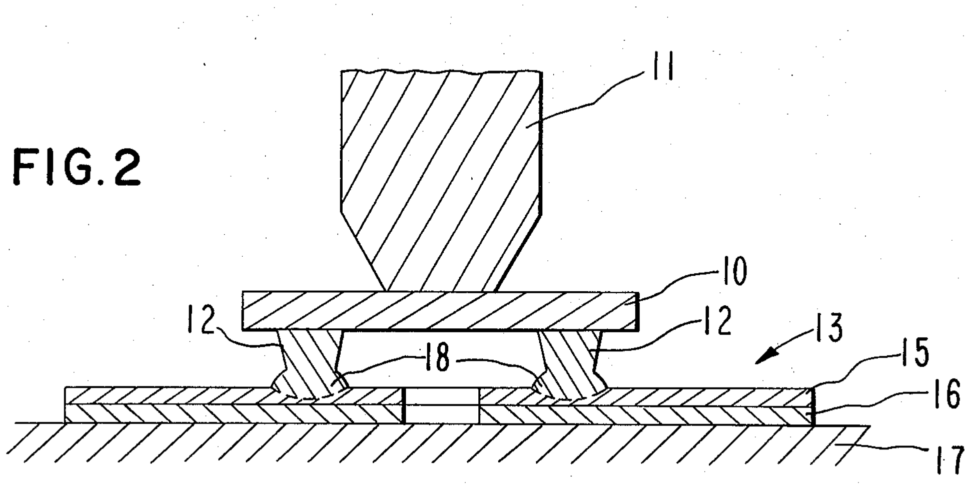
FIG. 2 shows the tool, the die, and the substrate after joinder.

Referring now to FIG 2, after melting, the metal in layer 15 actually rises towards the heated bumps 12 to form a fillets 18 as a joint between bumps 12 and layer 15. Fillets 18 comprise a new alloy formed by the mixture of the metal layer 15 with the now softened alloy of bumps 12. This softening occurs upon contact. If desired, the substrate 13 may be prewarmed.

Finally, the joined die 10 and substrate 13 are cooled with their registered metal patterns in contact, as shown in FIG 2. All of the metal in bumps 12, fillets 18 and layer 15 are solidified, causing a rigid mechanical and metallurgical joint between the two metal patterns.

It is sometimes beneficial in the joinder process to apply pressure by pushing downwardly upon tool 11 to force die 10 against substrate 13. For example, a pressure of less than about 75 grams is satisfactory. Where tool 11 holds die 10 by means of a vacuum, after joinder and cooling, the vacuum is released and tool 11 taken away from the backside of die 10. The joinder process is then completed.

What is claimed is:

1. The method of attaching a semiconductor die having an interconnecting metal pattern on one side of it, said die metal pattern having a given liquidus temperature, to a substrate which also has a substrate metal pattern upon it laterally corresponding at bonding locations with said metal pattern on the die, said substrate metal pattern having a liquidus temperature at least 10° C below the liquidus temperature of said die metal pattern, comprising:

1. picking up the die from its backside with a heated pickup tool;
2. transferring heat from said tool to said die metal pattern through said backside of said die, the amount of such transferred heat being sufficient to bring said die metal pattern above its solidus temperature but below its liquidus temperature;
3. placing said heated die metal pattern adjacent to, in mechanical contact with, and in registration with the corresponding substrate metal pattern in such a manner that sufficient heat from said heated die metal pattern is transferred at the bonding locations to said substrate metal pattern to cause said substrate metal pattern to melt, to rise, to form fillets with and to soften said die metal pattern; and
4. cooling said substrate and die with their registered metal patterns in contact, thereby resolidifying the metal and forming a rigid mechanical and metallurgical joint between the two metal patterns.

2. The method of claim 1 wherein the temperature to which the die is heated is selected so that heat transferred from said die metal pattern to said substrate metal pattern is sufficient to form an alloy between the two metal patterns upon their coming into mechanical contact.

* * * * *